(12) United States Patent
Tzeng

(10) Patent No.: US 8,865,105 B2
(45) Date of Patent: Oct. 21, 2014

(54) GRAPHENE AND ITS GROWTH

(71) Applicant: National Cheng Kung University, Tainan (TW)

(72) Inventor: Yon Hua Tzeng, Tainan (TW)

(73) Assignee: National Cheng Kung University, Tainan (TW)

( * ) Notice: Subject to any disclaimer, the term of this patent is extended or adjusted under 35 U.S.C. 154(b) by 0 days.

(21) Appl. No.: 13/753,707

(22) Filed: Jan. 30, 2013

(65) Prior Publication Data

US 2014/0050652 A1 Feb. 20, 2014

(30) Foreign Application Priority Data

Aug. 15, 2012 (TW) .............................. 101129502 A

(51) Int. Cl.

| C01B 31/30 | (2006.01) |
|---|---|
| C30B 29/64 | (2006.01) |
| C30B 25/18 | (2006.01) |
| C30B 29/02 | (2006.01) |
| C30B 25/02 | (2006.01) |

(52) U.S. Cl.
CPC .................. *C30B 25/02* (2013.01); *C30B 29/64* (2013.01); *C30B 25/18* (2013.01); *C30B 29/02* (2013.01); *Y10S 977/754* (2013.01)
USPC ...................................... 423/445 B; 977/754

(58) Field of Classification Search
CPC ........ C30B 25/02; C30B 25/18; C30B 29/02; C30B 29/64
USPC ...................................... 423/445 B; 977/754
See application file for complete search history.

(56) References Cited

U.S. PATENT DOCUMENTS

2010/0075130 A1* 3/2010 Meng et al. ................ 428/315.5

FOREIGN PATENT DOCUMENTS

| CN | 101285175 A | 10/2008 |
|---|---|---|
| CN | 102220566 A | 10/2011 |
| CN | 102491315 A | 6/2012 |

OTHER PUBLICATIONS

Large-Area Graphene Single Crystals Grown by Low-Pressure Chemical Vapor Deposition of Methane on Copper Xuesong Li, Carl W. Magnuson, Archana Venugopal, Rudolf M. Tromp, James B. Hannon, Eric M. Vogel, Luigi Colombo, and Rodney S. Ruoff Journal of the American Chemical Society 2011 133 (9), 2816-2819.*
Fan, L. et al. "Controllable growth of shaped graphene domains by atmospheric pressure chemical vapour deposition". Nanoscale, 2011, 3, 4946-4950.*
Nie, S. et al. "Origin of the mosaicity in graphene grown on Cu(111)". Physical Review B 84, 155425 (2011).*

(Continued)

*Primary Examiner* — Richard M Rump
(74) *Attorney, Agent, or Firm* — Bacon & Thomas, PLLC

(57) ABSTRACT

The present invention provides graphene nuclei including monolayer single-crystalline graphene nuclei and a method of growing from them two-dimensional graphene dendrites, with aspect ratio of the main branches increasing with growth time, on catalytic metal surface using thermal chemical vapor deposition. By controlling the supply rates of the carbon etching gas and the carbon deposition species, it results in graphene branches being merged to form a two-dimensional monolayer single-crystalline graphene plate and further allows multiple graphene plates to merge and form a large-area continuous monolayer graphene plate.

21 Claims, 1 Drawing Sheet

(56) References Cited

OTHER PUBLICATIONS

Tzeng, Y. "Controlled nucleation and growth of graphene: competitive growth and etching in hydrogen diluted methane". 2012 12th IEEE International Conference on Nanotechnology (IEEE-NANO) The International Conference Centre Birmingham Aug. 20-23, 2012, Birmingham, United Kingdom.*

Liu, Huaping, et al. "Dependence of carbon fiber morphology with deposition conditions." Diamond and Related Materials 17.3 (2008): 313-317.*

* cited by examiner

GRAPHENE AND ITS GROWTH

CROSS-REFERENCE TO RELATED APPLICATIONS

The present application relies on Taiwanese Patent Application No. 101129502 filed on Aug. 15, 2012. The abovementioned foreign application is herein incorporated by reference in their entirety.

BACKGROUND OF THE INVENTION

1. Field of the Invention

The invention relates to graphene dendrites with multiple branches of considerable aspect ratios and a method for growing such graphene structures on a solid surface, of which neighboring graphene branches may merge to form graphene plates.

2. Description of Related Art

Graphene refers to a two-dimensional material having a beehive-like lattice arrangement formed by carbon hybrid orbitals. It is optically transparent and has extraordinarily high thermal conductivity and electron mobility at room temperature as well as atomic level of low thickness and high mechanical strength. The unique and exceptional properties of graphene have lent itself to extensive industrial applicability in the functioning of photonic and electronic parts, fuel cells, electrochemical products, sensory devices, field emission, hydrogen storage and other power-supplying materials.

The currently known methods of making graphene include, for example, the following: (1) in separation method, individual graphene plates are separated from a graphite crystal by mechanical means or chemical means and their combination; however the size of the graphene plates synthesized from this method generally tend to be smaller than the graphite crystal so are not suitable for use in large-area applications; (2) in another method, silicon carbide are heated to a high temperature to remove silicon, which results in single-layer or multilayer graphene; but the graphene of such type cannot be easily adapted for uses on non-silicon carbide substances; and it can face problems when it is needed to prepare large-area graphene of a uniform thickness; (3) chemical vapor deposition is currently the most popularly known preparation method for making graphene; but its inclination to produce monolayer and multilayer polycrystalline graphene having island-like, small crystalline domains and plural grain boundaries can make it difficult to achieve flat monolayer, graphene having large crystalline domains, or large-area monolayer graphene plates. Besides, graphene formed by conventional chemical vapor deposition methods exhibits the morphology of a continuous film or plate. In consideration of the above issues, the present invention aims to provide graphene dendrites with high aspect ratios in their branches and a method for making the same including the formation of large, snowflake-like continuous single-crystalline monolayer graphene dendrites by starting with chemical vapor deposition method under a low gas pressure to prepare single crystalline, monolayer graphene nuclei; growing the graphene nuclei into a novel configuration, where the configuration refers to single-crystalline, monolayer graphene dendrites including snowflake-like graphene having branches of large aspect ratios, and, through modulating carbon etching gas, for example, hydrogen, and carbon source gases, for example, methane, supply, and combining the branches of one or more graphene dendrites to form a continuous graphene plate, including for example, single-crystalline and monolayer graphene plates

SUMMARY OF THE INVENTION

The main object of the present invention contemplates a novel graphene microstructure and preparation method for making the same, including, for example, single-crystalline, monolayer snowflake-like graphene dendrites by nucleating single-crystalline and monolayer graphene nuclei on metal surfaces by means of a chemical vapor deposition method, then permitting the graphene nuclei to grow into graphene dendrites including, for example, single-crystalline, monolayer snowflake-like graphene dendrites having four, five, or six main branches of large aspect ratio and many secondary and third branches. Branches of graphene dendrites can be further merged to form continuous graphene plates including, for example, single-crystalline, monolayer graphene plates by modulating input quantity of carbon etching gas or vapor, such as hydrogen and carbon-containing gases or vapor, such as methane. A large-area monolayer graphene plate can be obtained from a combination of multiple graphene plates. It should be noted here that the method of making novel configuration of graphene dendrites works to modulate the relative graphene growth rate and the carbon etching rate by, for example, adjusting input flow rates of hydrogen and methane gases. The step for carrying out chemical vapor deposition method to synthesize single-crystalline, monolayer dendritic graphene nuclei, plates, and films include: (A) feeding substrates with metal surfaces into a low pressure furnace, in which residual carbon-containing solid, liquid or gas may or may not exist; (B) introducing carbon-containing solid, liquid or gas into the furnace without residual carbon-containing solid, liquid or gas; (C) introducing carbon etching gases or vapor, such as hydrogen gas into the furnace at a flow rate according to the furnace diameter size and level of gas pressure, wherein the temperature of the furnace is in the range of 800° C. through 1060° C., preferred to be 1000° C. through 1050° C. when copper is used as the catalytic metal; adding metal-containing substrates into the furnace, and forming multiple graphene nuclei on the metal substrate; the introduced hydrogen gas can be used further to selectively etch defective graphene nuclei and non-graphene carbon deposits on the metal surface. Graphene nuclei that are loosely attached on the substrate and defective or non-single-crystalline, non-monolayer graphene and other non-graphene related carbon deposits would react with hydrogen to undergo gasification and be removed, the remaining graphene nuclei of higher quality would not interconnect to each other, and the majority of the remaining graphene nuclei would be heteroepitaxially aligned to the crystalline structure of the underlying metal and are aligned in the same direction; (D) the hydrogen-to-carbon atomic ratio in the precursor mixture containing hydrogen gas and methane gas in the input is selected between 4 (methane only) and 100, preferred 10 to 30, according to the diameter of the furnace and level of gas pressure in the furnace, so as to extend branches or extrusion of the graphene nuclei on the metal surface to form a snowflake-like graphene dendrite, in many cases, appearing like a snowflake. In step (A), the metal surface is a metal coating, a metal foil, or an object with metallic surfaces. The metal coating refers to a metal film coated on the surface of a non-metal solid or the surface of a metal that is different from the coated metal, and the metal coating or metal foil is either a metal made of a single element or an alloy formed by multiple metals, wherein the metal is at least selected from copper, nickel, gold, ruthenium, iridium, platinum, and an alloy thereof. The metal is preferably copper. The thickness of the metal can vary depending on the choice for metal coating or metal foil, and so is flexible, specifically, it can be 0.001 µm to 10,000 µm, and can preferably be 0.01 µm to 10,000 µm, and can preferably be 0.01 µm to 100 µm, or more preferably 0.1 µm to 30 µm. Furthermore, in step (A), the carbon source is gaseous hydrocarbon compound, volatile gases from solid hydrocarbon compound, vapor from liquid hydrocarbon compound, or can be a combination made of at least a carbonaceous solid or liquid. The carbonaceous solid can be graphite, amorphous carbon, and other carbonaceous species. The carbon source and the hydrogen gas in the furnace can work under high temperature to produce hydrocarbon compound, and the hydrocarbon can be methane, acetylene, carbon-and-hydrogen containing hydrocarbon oil and the likes, or a hydrocarbon compound made of at least oxygen, nitrogen, or fluorine. Liquid-state carbon source is selected at least from a hydrocarbon vacuum pump liquid provided in the generally accepted normal temperature and low vapor pressure. Solid carbonaceous deposit or liquid coagulum is stored in the low temperature region of the furnace before the chemical vapor deposition starts. The solid or liquid carbon source would then react with the hydrogen gas in the furnace to produce gaseous hydrocarbon, or the liquid carbon source would evaporate and react with hydrogen gas or would be transferred with hydrogen gas to a high temperature region to assume a role in the process of chemical vapor deposition. The hydrogen gas in step (A) can be steam or vapor from hydrocarbon compound or carbon-hydrogen-oxygen compound having a higher composition percentage of hydrogen and oxygen than composition percentage of carbon for the purpose of etching graphene or carbon coating on a non-graphene substantiate. Examples of carbon-hydrogen-oxygen compound include methanol, isopropanol and other compounds that exist as vapor under low atmosphere pressure and high temperature, and the hydrocarbon compound can be steam and other compounds. If there existing sufficient residual carbon sources in the furnace, no additional carbon containing gases need to be fed into the furnace for the nucleation of graphene nuclei. In step (B), if the furnace is free from carbon, small amount of carbon containing gases such as methane can be fed into the furnace. The substrate can be placed in a cool region to allow the reaction zone in the furnace to be heated to a pre-set nucleation and growth temperature with the option of remaining at the high temperature under hydrogen flow for a period of time ranging from a few minutes to a few hours for cleaning and conditioning the furnace surfaces. The substrate can later be pushed into the heated reaction zone without breaking the vacuum within one to few minutes. The substrate may remain at the pre-set nucleation temperature for a few minutes to a few hours, preferably one to three hours, to allow nucleation of graphene nuclei and selective etching of defective or non-heteroepitaxially nucleated nuclei as well as non-graphene carbon deposits leaving heteroepitaxially graphene nuclei of high quality on the metal surface. During this time period, metal is annealed and goes through crystalline transformation and re-growth for the optimization of the graphene nucleation and subsequent growth conditions.

In step (C) of the method for making snowflake-like graphene dendrites, the atmosphere pressure in the furnace ranges from 0.001 mTorr to 960 Torr, for which a preferred range is 0.01 mTorr to 1000 mTorr, and a more preferred range is 1 mTorr and 100 mTorr, and an even more preferred range is 20 mTorr and 60 mTorr; the graphene nuclei formed there are separated from each other although they are highly packed and have a diverse range of shapes and sizes depending on the crystalline properties of the underlying metal. The gas pressure in the furnace of step (D) can go between 0.001 mTorr and 960 Torr, and can preferably be between 0.01 mTorr and 1000 mTorr, and more preferably between 1 mTorr and 100 mTorr, and even more preferably between 20 mTorr and 60 mTorr, the better-quality graphene nuclei remaining on the metal surface after hydrogen etching for the most part exhibit four, five, or six short side lobes or branches of aspect ratios much smaller than those of the more extensively grown graphene dendrites. In step (D), the carbon source gas refers to one that can only be dissociated effectively from hydrocarbon with the present of a catalyst under the temperature at which graphene is synthesized. An example of the hydrocarbon is methane, and an example of the catalyst is a copper metal foil or a copper coated substrate. The length of time for the carbon source gas to pass into the furnace can be from 0.1 to 1000 minutes, which is preferably from 0.5 to 1000 minutes.

The abovementioned method for preparing single crystalline, monolayer snowflake-like graphene dendrites can further include a step (E) that involves reducing or completely stopping passing in carbon etching gases or vapor, such as hydrogen gas, and continuing passing in carbon source gas to permit combining the branches of single or multiple snowflake-like graphene dendrites, so as to form a continuous graphene plate or multiple plates.

The present invention further comprises graphene dendrites including single-crystalline and monolayer snowflake-like graphene dendrites, wherein the graphene dendrites are a result of consecutive processes starting with the graphene nuclei extending outwardly into many major branches, which extend into many secondary branches, which then extend into many third branches, and so on. The snowflake-like graphene dendrites are themselves structures built from results of the graphene nuclei extending outwardly into many branches according to the initial morphology and shape of each nucleus and the crystalline structure of the substrate. The shape of the graphene nuclei can be polygonal or possess six short branches or side-lobes according to the crystalline structure of metal substrate. As an example, graphene nuclei formed on a polycrystalline copper mostly have four, five, or six short branches or side-lobes depending on whether the copper domain is (200), (111) or other crystalline orientation. A more detailed account of the preparative method of the current invention is provided below: first, introduce 1 to 5 sccm (standard cubic centimeters per minute) hydrogen into a vacuum furnace having 5 centimeters in diameter at a residual gas or vapor pressure of 0.005 to 0.06 Ton until the furnace is heated to a temperature between 1000° C. to 1070° C. slightly below the melting point of the copper metal when copper foils are used as the substrates. The high temperature and vapor pressure reached at this stage are maintained for about 30 minutes to 120 minutes, while the 1 to 5 sccm hydrogen gas continuously passes into the furnace so as to etch away and reduce the residues remaining on the interior surface of the quartz tubing which makes the furnace. Next, insert a substrate with copper surface carried by a quartz vessel into the quartz tubing of the furnace, and at the same time continuously pass into the furnace 1 to 5 sccm hydrogen gas so as to etch the copper oxide on the copper flake and other residual impurities on the copper surface and create multiple graphene nuclei and other non-graphene carbon deposit. When the furnace is evacuated by a rotary mechanical pump using hydrocarbon pump oil, the steady-state gas pressure in the furnace consists of intentionally added hydrogen, residual gas and vapor, and unintentionally added vapor of hydrocarbon pump oil. It should be noticed that small graphene nuclei of only one atom thick take only a minute amount of carbon to be formed. Hydrogen gas molecules dissociate into hydrogen atoms through copper-based catalysis, the hydrogen atom can etch non-graphene carbon on the copper surface and graphene nuclei loosely connected to the copper surface, which can finally result in graphene nuclei uniformly distributed and well aligned on the copper surface. The carbon source giving rise to graphene may come from carbonaceous compound in the furnace or can come from methane, steam of hydrocarbon vacuum pump fluid, other hydrocarbon compounds, or carbon-hydrogen-oxygen compound. For example, hydrocarbon compound that would have remained liquid under room temperature would condense on inner walls of the furnace in the low temperature regions of the furnace, and would evaporate gradually to mix with hydrogen gas, flow or diffuse to the high temperature chemical vapor deposition region inside the furnace to proceed with graphene nucleation and growth. The copper foils is kept at the nucleation and annealing temperature, for example, 1030° C., for a time period ranging from a few minutes to several hours to allow the formation of graphene nuclei, preferred aligned heteroepitaxial graphene nuclei and for the annealing, transformation, and regrowth of copper crystalline grains to the lowest-energy state.

After 1 to 2 sccm carbon source gas such as methane is introduced to the furnace at 10 to 60 mTorr for about 0.5 to 30 minutes, snowflake-like graphene dendrites would be rapidly established on the copper surface from extension of the most suitable and fast-growing graphene nuclei. Through modulating the amount of hydrogen gas and carbon source gas entering into the furnace, methane gets to be added into hydrogen gas to create carbon deposits on the substrate, and these carbon deposits are transferred to the growing graphene by means of surface diffusion mechanism. Ostwald ripening effect speeds up the growth rate at which snowflake-like graphene dendrites extend outwardly from the protrusion of graphene nuclei for forming main branches having large aspect ratio (larger than 10 and have been demonstrated to increase with growth time to a ratio exceeding 100), and from the main branches extending further a second branch for forming a snowflake-like dendritic configuration. If graphene continues to grow, many large snowflake-like graphene dendrites will be formed, such will spread over the copper surface, and each will be individually separated by slim and small width-bearing alleys made of exposed copper metal. This setup is achieved by modulating the amount of hydrogen gas and carbon source gas entering into the furnace, and is intended to equilibrate the growth rate and etching rate of graphene on copper surface. To this end, termination of hydrogen gas going into the furnace can lead to merger of graphene branches for the purpose of making the plate-like graphene.

It should be understood now that for the above-mentioned preparative method for graphene dendrites, the graphene dendrites are created by permitting the graphene nuclei to extend outwardly main branches, and from the main branches to extend secondary branches. The heteroepitaxially nucleated graphene nuclei and the crystalline structure of the underlying copper guide the further extension of graphene branches into the final shape and morphology of the graphene dendrites. When a graphene dendrite is formed from a graphene nucleus with six branches or side-lobes, the extension outwards of those six branches or side-lobes results in a snowflake-like graphene dendrite with six-fold symmetry. Other graphene dendrites can grow into the configuration with mostly four, five, or six branches. These branches may grow across grain boundaries of the copper by changing preferred direction of growth fronts. The shape of the graphene nuclei can vary depending on the type of metal and the crystalline structure of the metal. As an example, copper would turn out to be mostly exhibiting six and four branches or side-lobes corresponding to hexagonal or square atomic arrangements of copper, and the configuration of graphene dendrites formed therefrom is a function of the shape of graphene nuclei, and such has six main branches, five main branches, four main branches or less often other numbers of main branches.

The graphene dendrites and plates obtained from the preparative method of the present invention has been demonstrated by experimental results as showing excellent quality and low barrier to be made into monolayer. The preparative method is simple and suitable for large-scale manufacturing.

DETAILED DESCRIPTION OF THE PREFERRED EMBODIMENT

EXAMPLE 1

Example 1 involves first providing an annealed copper foil of 99.98% purity, 0.025 mm thickness, that is disposed on a quartz vessel, and providing an electronic temperature controller-equipped furnace having three predetermined regions. The quartz pipe in the furnace is made into vacuum by turbomolecular pump, for which gas pressure is controlled through a feedback control loop by comparing a reading of the barometer against a predetermined pressure for regulating a throttle valve, and the incoming gas is modulated by electronic mass flow controllers. During the graphene nucleation and growth, only a rotary vane pump with hydrocarbon pump oil is used while the turbomolecular pump is by-passed from the gas flow. With the vapor of hydrocarbon compounds, obtained from the hydrocarbon pump fluid in the rotary vane pump, and the throttle valve is utilized to equilibrate the throughput and hydrogen gas intake of the pump within several tens of mTorr for carrying out low pressure chemical vapor deposition.

Figure 1A:
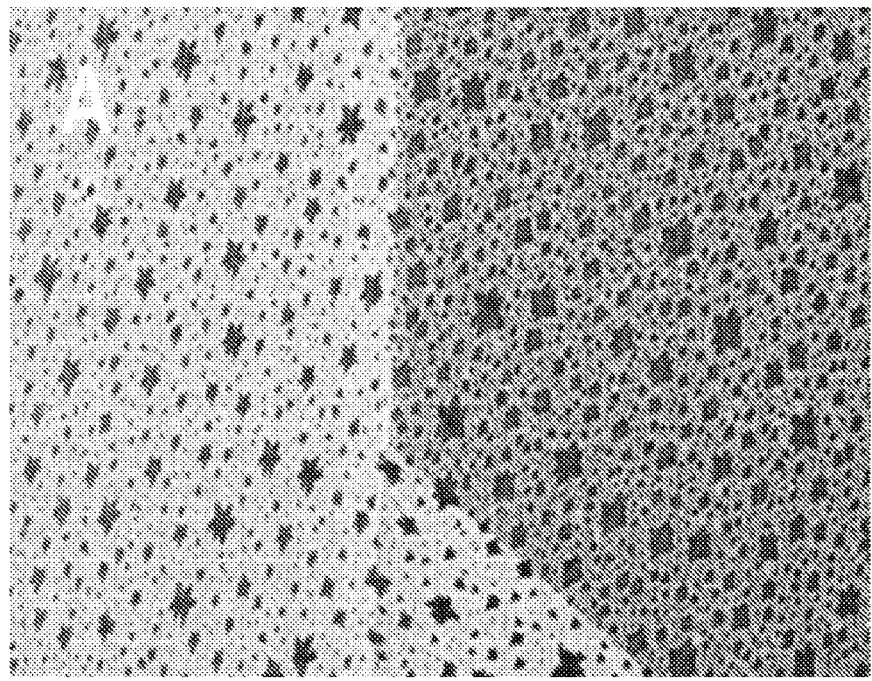
FIG. 1A is an electronic microscopic view of the graphene nuclei formed in Example 1 of the present invention.

The copper foil disposed on the quartz vessel is first placed away from the furnace's high-temperature region, 2 sccm hydrogen gas is introduced into the furnace with its temperature raised to reach between 1035° C. and 1050° C., at which the high-temperature furnace with hydrogen gas intake is maintained for about 60 minutes. Then, the quartz vessel is inserted into the quartz pipe of the carbon-source-containing furnace for about 60 minutes to form uniformly distributed single crystalline, monolayer graphene nuclei on the copper foil. As shown in FIG. 1A, the graphene nuclei-formed on the polycrystalline copper mostly has 6 or 4 protrusions.

EXAMPLE 2

Figure 1B:
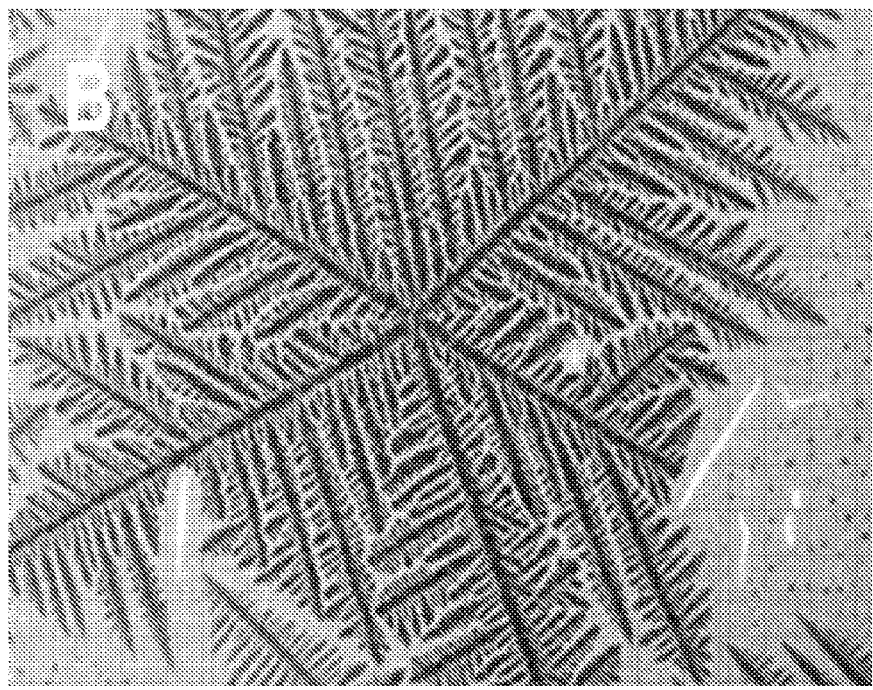
FIG. 1B is an electronic microscopic view of a snowflake-like graphene dendrite formed in Example 2 of the present invention.

After multiple graphene nuclei are created according to the method of Example 1, if multiple graphene dendrites are desired on the copper foil surface, copper foil would be required to stay in the quartz pipe of the furnace, and the copper foil would need to continue to be maintained in a high temperature state and the hydrogen gas intake would need to be maintained. Also a predetermined flow rate and intake time of 1 minute to 30 minutes of 2 sccm methane gas should be put in place. Hydrogen gas would still be permitted to enter after the intake time but methane gas is stopped, and the copper foil is pulled out of the furnace's high temperature region without breaking the vacuum. As shown in FIG. 1B, the graphene dendrite has 6 main branches, and each main branch has a large aspect ratio, and the main branch can give rise to multiple second branches, and more branches thereon, for forming novel snowflake-like graphene dendrites.

EXAMPLE 3

If it is desired to take a further step into turning snowflake-like graphene dendrites into merged graphene plates, it would be required to, following the end of Example 1 of a method for creating multiple graphene nuclei, continue maintaining the high temperature status and terminate the intake of hydrogen gas, introduce 2 sccm methane of a predetermined flow rate and an intake time of 30 minutes to 100 minutes, and then turn off the methane flow and pull the quartz carrier of the copper foils out of the high temperature region of the furnace. At this point, branches of multiple snowflake-like graphene flakes on the copper foil would grow laterally and merge to form a plate-like graphene film.

The embodiments of the present invention recited herein are intended to be merely exemplary, the scope of the present invention should be as defined by the claims appended thereto, and not particularly limited by the above embodiments.

What is claimed is:

1. Graphene dendrites with multiple branches having aspect ratios larger than 10; wherein the graphene dendrites comprise six primary branches extending outwardly from a graphene nuclei, from which many secondary branches extend and from which many third branches extend, and so on; and wherein the graphene dendrite exhibits six-fold symmetry.

2. Graphene dendrites with multiple branches having aspect ratios larger than 10; wherein the graphene dendrites comprise multiple primary branches extending outwardly from a graphene nuclei, from which many secondary branches extend and from which many third branches extend, and so on; wherein the morphology of graphene varies with the shape of a graphene nuclei; and wherein the number of primary branches is selected from the group consisting of four, five and six primary branches depending on the crystalline structure of the graphene nucleation sites on the surface of the substrate.

3. A method for nucleating and growing graphene dendrites with multiple branches having aspect ratios larger than 10, comprising the following steps of:
(A) placing substrates made of or coated by catalytic metals, needed for catalytic dissociation of hydrocarbons and other carbon-containing precursors, into a furnace containing carbon sources, wherein the furnace runs under a pressure below ambient atmosphere;
(B) introducing a hydrogen gas flow into the furnace and heating the furnace in accordance with the size of the furnace and level of the gas pressure, then forming multiple graphene nuclei on the substrate, wherein the introduced hydrogen gas after being catalytically dissociated by the catalytic metal operates to selectively etch defective graphene nuclei and non-graphene carbon deposits on the substrate, remove structurally immature graphene nuclei and retain multiple structurally mature graphene nuclei, the structurally immature graphene nuclei and the structurally mature nuclei are not interconnected to each other; and
(C) based on the size of the furnace and level of the gas pressure, introducing a gas or vapor mixture containing carbon-containing sources for depositing graphene and a carbon etching gas or vapor to permit graphene to extend from branches of the graphene nuclei on the substrate to form graphene dendrites with multiple dendrites having aspect ratios greater than 10;
wherein the graphene dendrites comprise multiple primary branches, from which many secondary branches extend and then from which many third branches extend, and so on; and wherein the branches are single crystalline and monolayer graphene.

4. The method according to claim 3, wherein in step (A), the metallic substrate is a metal coated solid substrate, a metal foil, or a metal object of any desired shape.

5. The method according to claim 4, wherein the metal coating has a thickness ranging from 0.001 μm to 10,000 μm.

6. The method according to claim 4, wherein the metal foil has a thickness ranging from 1 μm to 10,000 μm.

7. The method according to claim 4, the metal is selected from the group consisting of copper, nickel, gold, ruthenium, iridium, platinum, and an alloy thereof.

8. The method according to claim 4, the metal is preferred to be copper.

9. The method according to claim 4, wherein the metal coating is coated on the surface of a non-metallic solid or a substrate of a different metal, metal compounds, or alloys.

10. The method according to claim 3, wherein in step (A), the carbon source is residual carbon containing species on the substrates or on the inner surfaces of the furnace, or hydrocarbon species fed intentionally into the furnace.

11. The method according to claim 10, wherein the residual carbon source is at least one selected from the group consisting of vapor of a carbon containing gas, solid, or liquid, and hydrocarbon reaction products formed by reactions of the carbon sources with the hydrogen gas flowing inside the furnace.

12. The method according to claim 11, wherein, before the chemical vapor deposition begins, the solid carbon containing deposit or liquid coagulum are stored in the low temperature region of the furnace, the carbon containing solid or carbon containing liquid carbon source would react with hydrogen gas in the furnace to produce gaseous hydrocarbon, or the carbon containing liquid would evaporate and react with hydrogen gas or be transferred with hydrogen to a high temperature region to participate in the process of chemical vapor deposition.

13. The method according to claim 12, wherein the liquid carbon source is at least one selected from a hydrocarbon vacuum pump liquid provided in the generally accepted normal temperature and low vapor pressure.

14. The method according to claim 12, wherein the carbon source is at least one selected from the group consisting of hydrocarbon compound, and a hydrocarbon compound containing oxygen, nitrogen, and fluorine.

15. The method according to claim 3, wherein in step (A), the gas pressure of the furnace ranges from 0.001 mTorr to 960 Torr.

16. The method according to claim 3, wherein in step (A), the gas pressure is preferred to range from 10 mTorr to 100 mTorr.

17. The method according to claim 3, wherein in step (C), the carbon containing gas is a hydrocarbon compound that can dissociate effectively only with the presence of a catalyst in a temperature range of 800° C. to 1050° C.

18. The method according to claim 3, wherein step (C), the carbon containing gas is a hydrocarbon compound that can dissociate effectively at 1000° C.-1060° C. in the presence of copper catalyst.

19. The method according to claim 3, wherein in step (C), the carbon source gas is methane.

20. The method according to claim 3, wherein in step (C), a length of time for the carbon source gas to pass into the furnace ranges from 0.1 to 1000 minutes.

21. Graphene dendrites with multiple branches having aspect ratios larger than 10; wherein the graphene dendrites comprise multiple primary branches extending outwardly from a graphene nuclei, from which many secondary branches extend and from which many third branches extend, and so on; wherein the branches are single crystalline and monolayer graphene.

* * * * *